US011018633B2

(12) United States Patent
Li et al.

(10) Patent No.: US 11,018,633 B2
(45) Date of Patent: May 25, 2021

(54) METHOD AND APPARATUS FOR CALIBRATING DIGITAL PRE-DISTORTION OF CELLULAR TRANSMITTER

(71) Applicant: Samsung Electronics Co., Ltd., Gyeonggi-do (KR)

(72) Inventors: Liangbin Li, San Diego, CA (US); Gennady Feygin, San Diego, CA (US); Pranav Dayal, San Diego, CA (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/752,017

(22) Filed: Jan. 24, 2020

(65) Prior Publication Data
US 2020/0336117 A1    Oct. 22, 2020

Related U.S. Application Data

(60) Provisional application No. 62/835,921, filed on Apr. 18, 2019.

(51) Int. Cl.
*H04B 1/04* (2006.01)
*H03F 1/32* (2006.01)
(Continued)

(52) U.S. Cl.
CPC ......... *H03F 1/3241* (2013.01); *H03F 1/0294* (2013.01); *H03F 3/211* (2013.01);
(Continued)

(58) Field of Classification Search
CPC ... H01B 1/02; H01B 1/04; H01B 1/16; H01B 1/40; H01B 1/0425; H01B 1/0475;
(Continued)

(56) References Cited

U.S. PATENT DOCUMENTS

| | | | | |
|---|---|---|---|---|
| 7,724,182 B2 * | 5/2010 | Inoue | ................... | G01S 7/4004 342/165 |
| 8,064,850 B2 * | 11/2011 | Yang | .................... | H03F 1/3247 455/114.3 |

(Continued)

FOREIGN PATENT DOCUMENTS

| WO | WO 2018/007303 | 1/2018 |
|---|---|---|
| WO | WO 2018/017694 | 1/2018 |

(Continued)

OTHER PUBLICATIONS

Liu, Xin et al., "Beam-Oriented Digital Predistortion for Hybrid Beamforming Array Utilizing Over-the-Air Diversity Feedbacks", 2019 IEEE/MTT-S International Microwave Symposium, Copyright 2019 IEEE, pp. 987-990.

*Primary Examiner* — Quochien B Vuong
(74) *Attorney, Agent, or Firm* — The Farrell Law Firm, P.C.

(57) ABSTRACT

A method and an apparatus are provided for calibrating digital pre-distortion (DPD) of an electronic device. A respective signal is received, by each of a first plurality of receiving antennas, from each of a second plurality of transmitting antennas. A DPD function is determined for each of the second plurality of transmitting antennas based on the received signals. A combined DPD function of the second plurality of transmitting antennas is determined based on the DPD functions and phase shifter settings associated with the second plurality of transmitting antennas.

22 Claims, 6 Drawing Sheets

(51) Int. Cl.
 *H04W 52/42* (2009.01)
 *H03F 1/02* (2006.01)
 *H03F 3/24* (2006.01)
 *H03F 3/21* (2006.01)

(52) U.S. Cl.
 CPC ............. *H03F 3/24* (2013.01); *H04B 1/0475* (2013.01); *H04W 52/42* (2013.01); *H04B 2001/0425* (2013.01)

(58) Field of Classification Search
 CPC .... H01B 1/0483; H01B 1/406; H01B 7/0408; H01B 7/0413; H01B 7/0617; H01B 17/11; H01B 17/12; H01B 17/13; H01B 2001/0408; H01B 2001/0425; H01B 2001/0433; H04M 2203/057; H03F 1/3241; H03F 1/3247; H03F 1/3282; H03F 3/195; H03F 3/211; H03F 2200/451; H03F 2201/3233
 See application file for complete search history.

(56) References Cited

U.S. PATENT DOCUMENTS

| | | | | |
|---|---|---|---|---|
| 8,195,103 | B2 * | 6/2012 | Waheed | H04B 1/0475 455/114.3 |
| 8,577,311 | B2 * | 11/2013 | Wolf | H03F 1/3247 455/114.3 |
| 8,705,339 | B2 * | 4/2014 | Takaoka | H04L 5/0005 370/210 |
| 9,525,205 | B2 * | 12/2016 | Oh | H01Q 3/38 |
| 9,979,421 | B2 * | 5/2018 | Astrom | H04B 1/0475 |
| 10,333,474 | B2 * | 6/2019 | Alon | H03F 1/0227 |
| 10,374,730 | B2 * | 8/2019 | Rainish | H04B 7/0417 |
| 10,587,355 | B2 * | 3/2020 | Park | H04H 20/71 |
| 2018/0191314 | A1 | 7/2018 | Pratt et al. | |
| 2019/0131934 | A1 | 5/2019 | Khalil et al. | |
| 2019/0181923 | A1 | 6/2019 | Nammi | |
| 2019/0222326 | A1 | 7/2019 | Dunworth et al. | |
| 2020/0091608 | A1 * | 3/2020 | Alpman | H04B 7/0639 |

FOREIGN PATENT DOCUMENTS

| | | |
|---|---|---|
| WO | WO 2018/219466 | 12/2018 |
| WO | WO 2019/029827 | 2/2019 |
| WO | WO 2019/092476 | 5/2019 |
| WO | WO 2019/110327 | 6/2019 |
| WO | WO 2019/132949 | 7/2019 |

* cited by examiner

METHOD AND APPARATUS FOR CALIBRATING DIGITAL PRE-DISTORTION OF CELLULAR TRANSMITTER

PRIORITY

This application is based on and claims priority under 35 U.S.C. § 119(e) to a U.S. Provisional Patent Application filed on Apr. 18, 2019 in the United States Patent and Trademark Office and assigned Ser. No. 62/835,921 the contents of which are incorporated herein by reference.

FIELD

The present disclosure relates generally to a wireless communication system, and more particularly, to a method and an apparatus for calibrating digital pre-distortion (DPD) of a cellular transmitter.

BACKGROUND $5^{th}$ generation (5G) cellular technology employs antenna arrays and beamforming for link reliability. Each antenna in an array may be driven by a power amplifier (PA). However, such a PA is typically severely nonlinear. Therefore, DPD is required to reduce transmitter chain non-linearity and maintain low power consumption and efficiency of the PA. Specifically, DPD may be used to improve performance of PAs operating in nonlinear regions.

Architecture known as analog beamforming with a shared transmitter path (up to a splitter stage before a phase shifter) is commonly used because of its advantageous cost and power consumption characteristics. However, there is generally a mismatch between PA characteristics of the different PAs. The DPD in analog beamforming architecture is in a common portion of the transmit path and must be shared between multiple PAs.

Typically, DPD technology is oriented toward using a single DPD function for each PA. This results in a system that is expensive in implementation cost, requires higher power consumption, and requires a larger number of pins on a digital chip, radio frequency integrated circuit (RFIC) chip and printed circuit board (PCB) routing resources and complexity.

SUMMARY

According to one embodiment, a method is provided for calibrating DPD of an electronic device. Each of a first plurality of receiving antennas receive a respective signal from each of a second plurality of transmitting antennas. A DPD function is determined for each of the second plurality of transmitting antennas based on the received signals. A combined DPD function of the second plurality of transmitting antennas is determined based on the DPD functions and phase shifter settings associated with the second plurality of transmitting antennas.

According to one embodiment, an electronic device is provided. The electronic device includes a first plurality of receiving antennas, a processor, and a non-transitory computer readable storage medium storing instructions that, when executed, cause the processor to receive a respective signal, by each of the first plurality of receiving antennas, from each of a second plurality of transmitting antennas. The instructions also cause the processor to determine a DPD function for each of the second plurality of transmitting antennas. The instructions further cause the processor to determine a combined DPD function of the second plurality of transmitting antennas based on the DPD functions and phase shifter settings associated with the second plurality of transmitting antennas.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
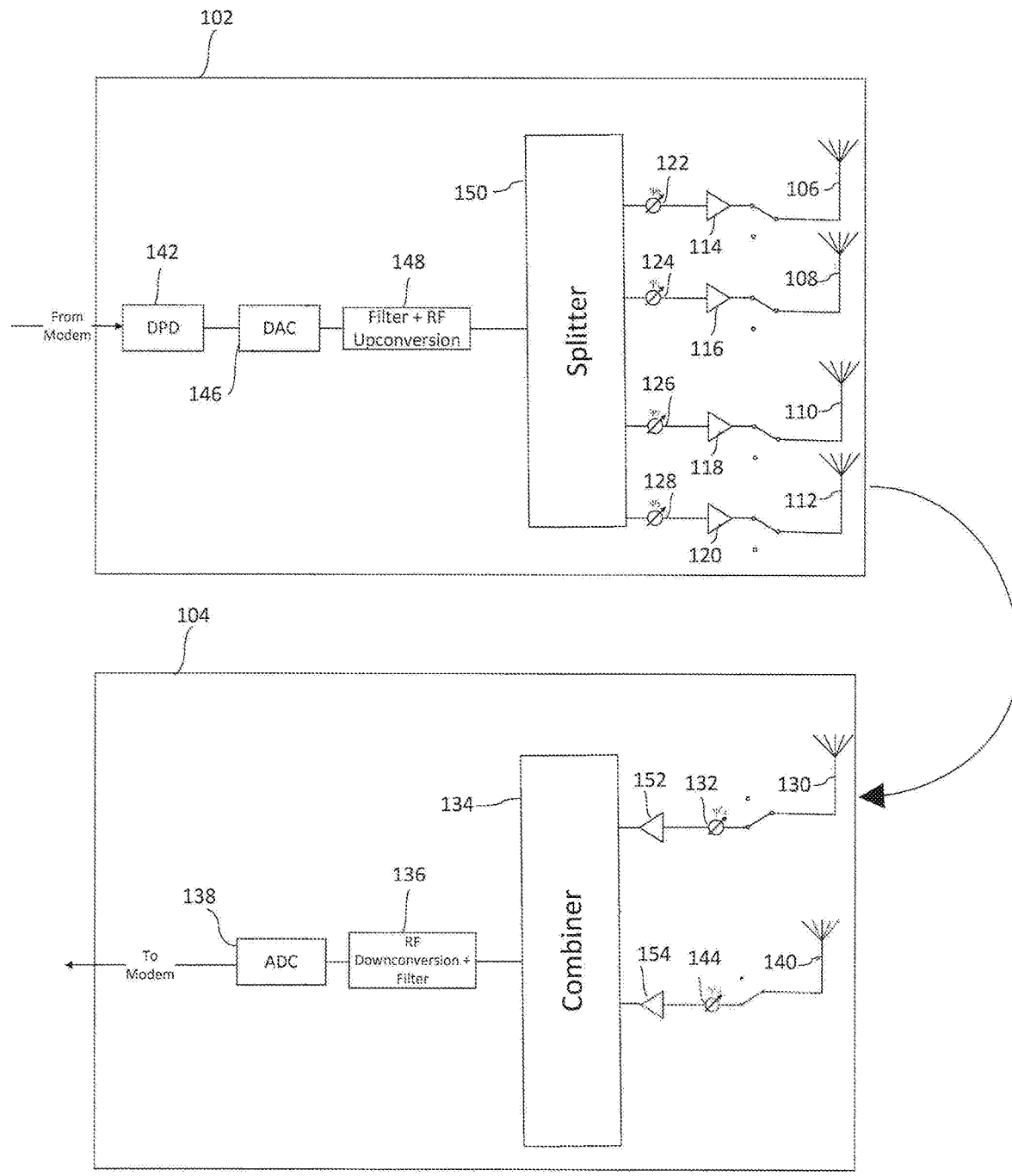
FIG. 1 is a diagram illustrating an over-the-air method of DPD calibration, according to one embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate the existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "1$^{st}$," "2$^{nd}$," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, such as, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

The present disclosure describes a system and method that measures individual DPD characteristics of each PA's non-linearity. Measurements may be performed over the air (OTA) at a distance using test equipment, or employing a coupler at the output of the antenna connection by connecting a feedback receiver to the coupler and capturing a feedback signal in the digital domain at the output of the receiver's analog-to-digital converter (ADC).

FIG. 1 is a diagram illustrating an over-the-air (OTA) method of DPD calibration, according to an embodiment. For example, an OTA coupling between an antenna configured as a transmit antenna, for example, antennas 0 through 3, and an antenna configured as a receive antenna, for example, antenna 4.

A transmitter 102 includes a DPD block 142 that receives a digital signal from a modem on the transmitter side. An output of the DPD block 142 is connected to a digital-to-analog converter (DAC) 146 to output an intermedia frequency signal. The intermediate frequency signal from the DAC 146 is provided to a filter and RF converter 148 to output an RF frequency signal. The RF frequency signal is provided to a splitter 150 where the RF frequency signal is split into multiple signal paths. Each signal path is provided to a respective phase shifter (i.e., a phase shifter-0 122, a phase shifter-1 124, a phase shifter-2 126, and a phase-shifter-3 128) and a respective PA (i.e., PA-0 114, PA-1 116, PA-2, 118, and PA-3 120). Each PA is connected to a respective transmit antenna in a phased array (i.e., a transmit antenna-0 106, a transmit antenna-1 108, a transmit antenna-2 110, and a transmit antenna-3 112).

A receiver 104 includes a phased array including a receive antenna-4 130 and a receive antenna-5 140. The receive antenna-4 130 and the receive antenna-5 140 are each connected to a respective phase shifter-4 132 and phase shifter-5 144, and a respective PA-4 152 and PA-5 154. A received signal is provided to a combiner 134, before a radio frequency (RF) downconverter and filter 136 and an ADC 138. The output of the ADC 138 is provided to a modem on the receiver side.

Individual DPD functions are computed for each PA. The individual DPD functions are then mathematically combined, at the combiner 134, to form a composite DPD. Mathematical combining includes accounting for a phase shift of each individual PA-antenna pair based on a phase shift setting selected for all steering directions in a codebook.

Combining may be performed by estimating an overall PA response of each PA in the array up to the output of the antenna, including a PA's inherent non-linear amplitude/phase, and extra phase shift introduced by a phase shifter. An estimated response of an equivalent combined PA is determined. Specifically, an estimated response of the combined PA is determined as a summation of individual PAs in the complex domain. For each beam-steering direction, DPD characteristics are derived, based on the combined PA output.

Gain and phase can be recovered by choosing a pair of transmitters, a pair of receivers, and performing four amplitude and phase measurements. For example, if the transmit antenna-0 106, the transmit antenna-1 108, the receive antenna-4 130, and an additional receive antenna-5 are used, four amplitude A measurements are performed, as set forth in Equation (1) below.

$$A_{04}=T_0G_{04}R_4$$

$$A_{14}=T_1G_{14}R_4$$

$$A_{05}=T_0G_{05}R_5$$

$$A_{15}=T_1G_{15}R_5 \qquad (1)$$

Here, $T_i$ is a transmit gain of a transmitter associated with and including antenna i. $R_j$ is a receive gain of a receiver associated with and including antenna j. $G_{ij}$ is a coupling gain coefficient between antenna i and antenna j.

Equation (1) includes four equations with 8 unknowns ($T_0$, $T_1$, $R_4$, $R_5$, $G_{04}$, $G_{14}$, $G_{05}$, $G_{15}$). However, an absolute value of $T_0$ and $T_1$ is not needed, only $T_1$-$T_0$, $R_5$-$R_4$, $G_{05}$-$G_{04}$, $G_{14}$-$G_{04}$, and $G_{15}$-$G_{04}$ are required. All values of T, G, and R are in dB. This reduces the number of unknowns to 5. The equation may be further reduced if $R_4$ and $R_5$ are independently calibrated using a known signal, or if $T_0$ and $T_1$ are calibrated using a Peak detector.

Figure 2A:
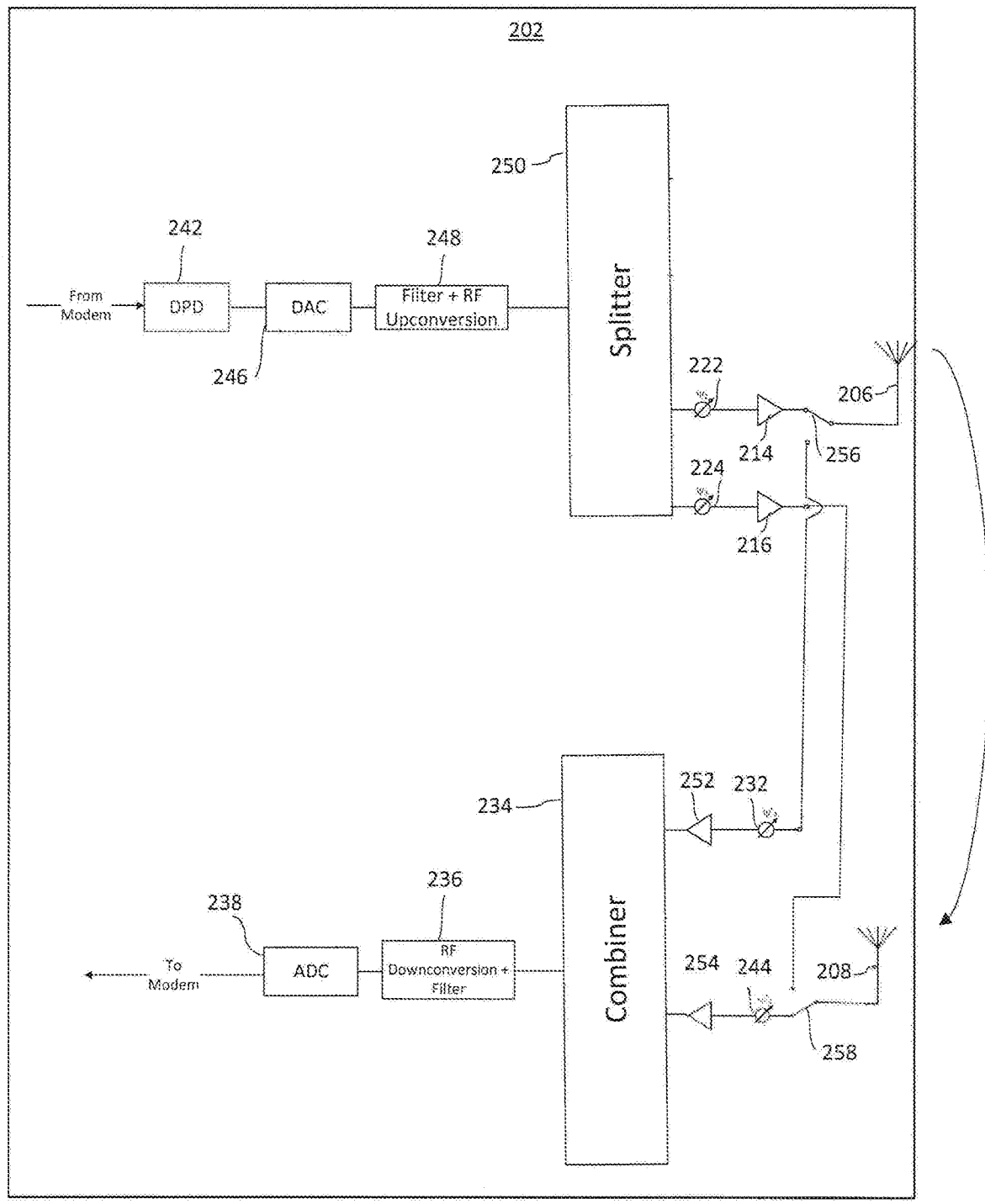
FIGS. 2A and 2B are a diagrams illustrating an OTA method of DPD calibration, according to another embodiment.
Figure 2B:
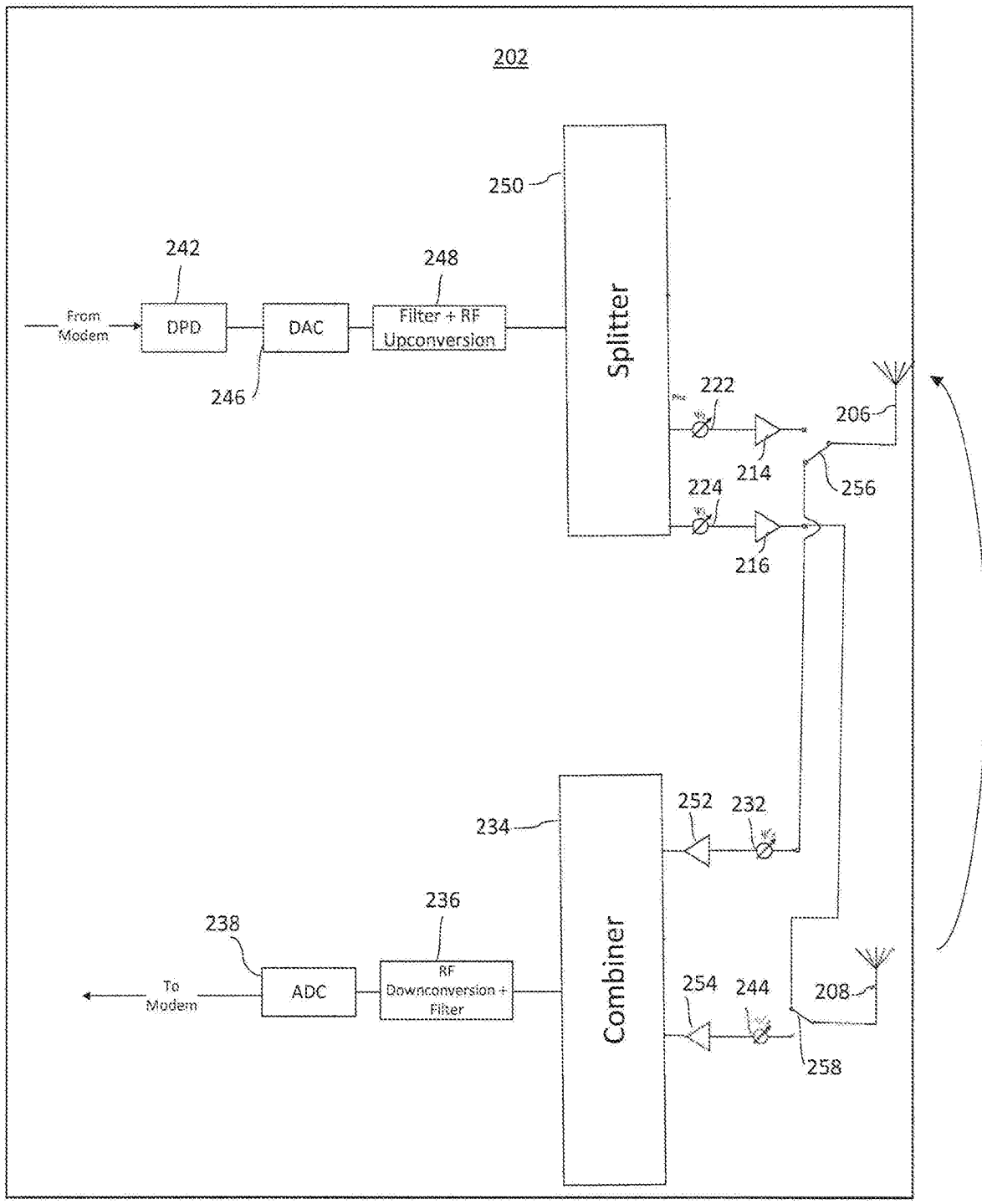

FIGS. 2A and 2B are diagrams illustrating an OTA method of DPD calibration, according to another embodiment. For example, an OTA coupling is provided between a first antenna of a transceiver, used as a transmit antenna, and a second antenna of the transceiver, used as a receive antenna.

In FIG. 2A, a transceiver 202 includes a DPD block 242 that receives a digital signal from a modem. An output of the DPD block 242 is connected to a DAC 246 to output an intermedia frequency signal. The intermediate frequency signal from the DAC 246 is provided to a filter and RF converter 248 to output an RF frequency signal. The RF frequency signal is provided to a splitter 250 where the RF frequency signal is split into multiple signal paths. Each signal path is provided to a respective phase shifter (i.e., a phase shifter-0 222, a phase shifter-1 224) and a respective PA (i.e., PA-0 214, PA-1 216). Each PA is connected to a respective antenna in a phased array (i.e., an antenna-0 206, an antenna-1 208).

The antenna-0 206 and the antenna-1 208 are each connected to a respective phase shifter-2 232 and phase shifter-3 244, and a respective PA-2 252 and PA-3 254. A received signal is provided to a combiner 234, before an RF down-converter and filter 236 and an ADC 238. The output of the ADC 238 is provided to the modem.

In the embodiment of FIG. 2A, based on a position of a first switch 256, a signal is transmitted from the antenna-0 206, and based on a position of a second switch 258, the signal is received at the antenna-1 208.

FIG. 2B includes the same elements and configurations as FIG. 2A, with the exception of the positions of the first switch 256 and the second switch 258.

In the embodiment of FIG. 2B, based on a position of the second switch 258, a signal is transmitted from the antenna-1 208, and based on a position of the first switch 256, the signal is received at the antenna-0 206.

According to an embodiment of the present disclosure, in a system in which 4 antennas are considered (0, 1, 2, 3), each antenna can be used in a receive or transmit configuration. Thus, (4, 3)=12 pair-wise transmit/receive experiments are performed and gains are measured. Gains are measured at a low transmit power to ensure that the transmission is in a linear region. A turnaround gain ($G_{ij}$) is measured when transmitting from antenna i and receiving at antenna j. $T_i$ is a transmit gain of a transmitter associated with and including antenna i. $R_j$ is a receive gain of a receiver associated with and including antenna j. $C_{ij}$ is a coupling gain coefficient between antenna i and antenna j, and is reciprocal (e.g., $C_{ij}=C_{ji}$).

The following 12 measurements and corresponding equations are obtained as set forth below as a matrix equation in Equation (2):

$G_{01}=T_0C_{01}R_1$ $G_{10}=T_1C_{01}R_0$ $G_{02}=T_0C_{02}R_2$ $G_{20}=T_2C_{02}R_0$ $G_{03}=T_0C_{03}R_3$ $G_{30}=T_3C_{03}R_0$ $G_{12}=T_1C_{12}R_2$ $G_{21}=T_2C_{12}R_1$ $G_{13}=T_1C_{13}R_3$ $G_{31}=T_3C_{13}R_1$ $G_{23}=T_2C_{23}R_3$ $G_{32}=T_3C_{23}R_2$ (2)

There are 4 transmit gains, 4 receive gains, and 6 coupling gain coefficients, totaling 14 unknowns. As described above, only the relative values of T are needed, and a normalized value of $t_i$ can be determined, as set forth in Equation (3) below. This reduces the number of variables to 12, which is equal to the number of equations in the matrix. The equations can then be solved for $t_i$.

$$t_i = T_i/T_0, c_{ij} = C_{ij}/C_{01}, r_i = R_i \times (T_0 \times C_{01}) \quad (3)$$

The distortion characteristics of individual PAs can now be combined. If antenna i has a distortion function $f_i$, a combined distortion $f_{comb}$ in a boresight direction (e.g., a direction of maximum gain) is set forth in Equation (4) below.

$$\hat{f}_{comb} = \sum_i t_i f_i \quad (4)$$

If the beam is oriented in a direction other than the boresight direction, an $i^{th}$ antenna will have its phase shifter set to $\phi_i$. As a result, a combined distortion $f_{comb}$ in a non-boresight direction is set forth in Equation (5) below.

$$\hat{f}_{comb} = \sum_i t_i e^{j\phi i} f_i \quad (5)$$

Figure 3:
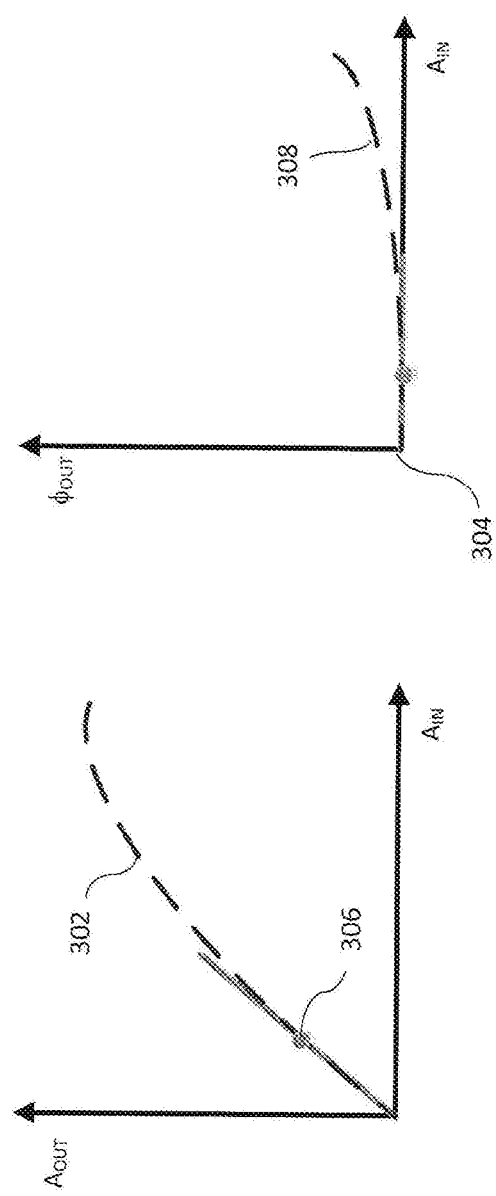
FIG. 3 illustrates an amplitude modulation-to-amplitude modulation (AM-AM) curve and an amplitude modulation-to-phase modulation (AM-PM) curve.

A method is also required to discover distortion characteristics of individual PAs. Two transmissions and measurements are performed. A low power transmission keeps a PA in a linear region. A high power transmission pushes a PA into a non-linear region. FIG. 3 illustrates an amplitude modulation-to-amplitude modulation (AM-AM) curve and an amplitude modulation-to-phase modulation (AM-PM) curve. An AM-AM curve 302 has input amplitude $A_{IN}$ on the x-axis and output amplitude $A_{OUT}$ on the y-axis. An AM-PM curve 304 has input amplitude $A_{IN}$ on the x-axis and output phase $\phi_{OUT}$ on the y-axis. Low power measurement is indicated by points 306 and 308 on the curves. High power measurement is based on using a full range of $A_{IN}$. A distortion is calculated as set forth in Equation (6) below.

$$f(A_{IN}) = A_{OUT}(A_{IN}) * e^{j\phi_{OUT}(A_{IN})} \quad (6)$$

Accordingly, with respect to the two phases described above, in a first phase a low-power signal is transmitted at a predefined amplitude $A_0$ and a received signal is measured. A ratio of the received signal of the transmitted signal establishes a gain and phase of the path. This establishes a low-power or linear-PA region gain and phase, $G(A_0)$ and $\phi(A_0)$, where $A_0$ is a chosen transmission amplitude.

In a second phase, a modulated signal that varies over a wide power range, which includes the previously measured low-power range, is measured. At each transmit amplitude, a ratio of a received signal to a transmitted signal is computed.

This provides gain and phase a function of a transmitted amplitude: gains $G(A_1), G(A_2), \ldots G(A_N)$ and phases $\phi(A_1), \phi(A_2) \ldots \phi(A_N)$, where $A_1$ through $A_N$ are amplitudes a transmitter is producing as the transmitted modulated waveform varies. Values of $A_1 \ldots A_N$ are typically selected over a uniform grid from 0 to the largest amplitude desired for DPD.

The ratios of $G(A_1)/G(A_0), G(A_2)/G(A_0) \ldots G(A_N)/G(A_0)$ and the phase differences $\phi(A_1)-\phi(A_0), \phi(A_2)-\phi(A_0), \ldots \phi(A_N)-\phi(A_0)$ are computed.

Figure 4:
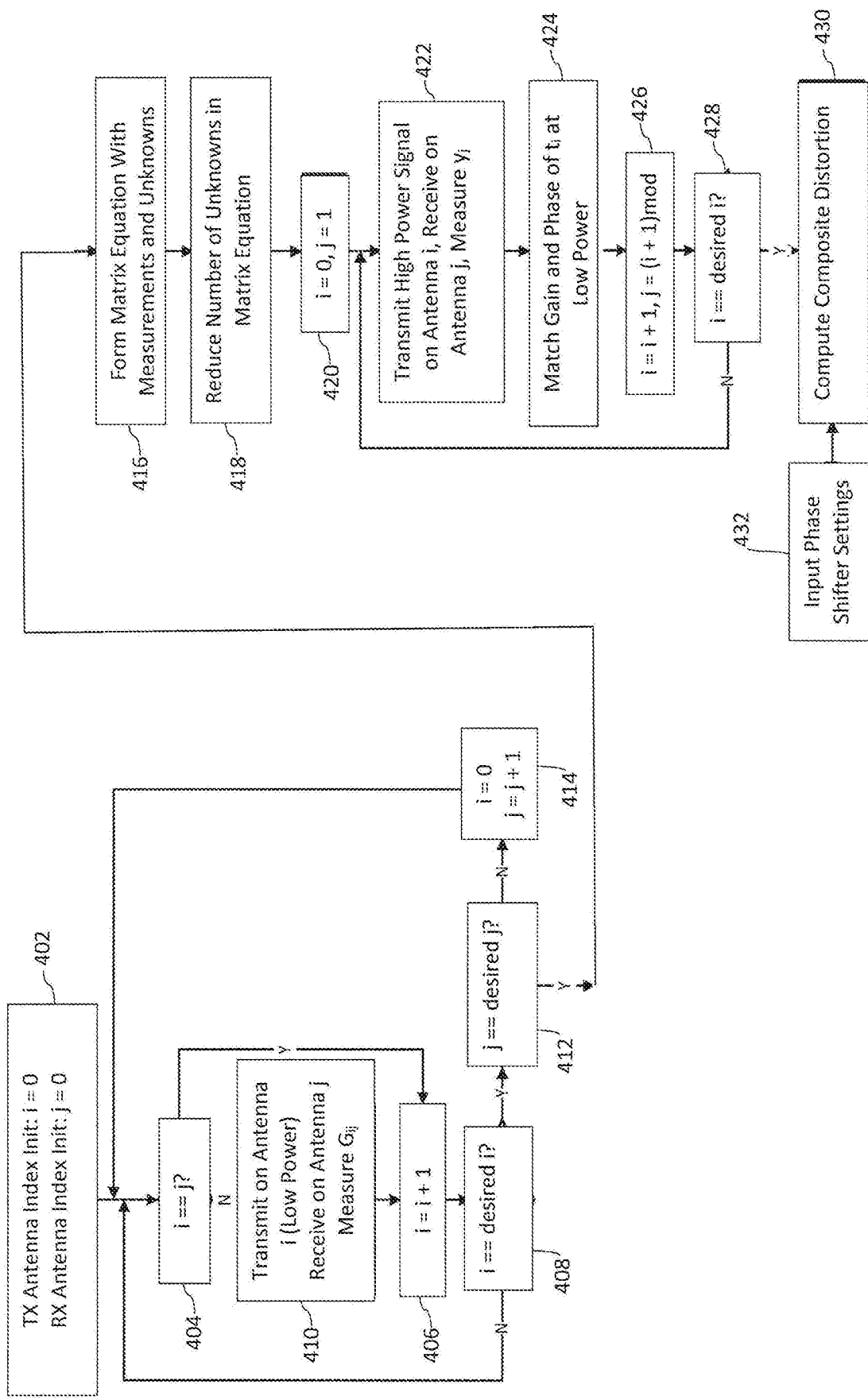
FIG. 4 is a flow chart illustrating a method for DPD calibration, according to one embodiment.

An inverse function is constructed that maps amplitude $G(A_1)/G(A_0) \to A_1, G(A_2)/G(A_0) \to A_2, \ldots G(A_N)/G(A_0) \to A_N$, and phase $G(A_1)/G(A_0) \to -(\phi(A_1)-\phi(A_0)), G(A_2)/G(A_0) \to -((A_2)-\phi(A_0)), \ldots G(A_N)/G(A_0) \to -(\phi(A_N)-\phi(A_0))$ Referring now to FIG. 4, a flow chart illustrates a method for DPD calibration, according to an embodiment. The method utilizes 4 antennas (0, 1, 2, 3), and each antenna can be used in a receive or transmit configuration.

In the first phase of calibration, a signal with low power is transmitted. All gain and phase of the transmission are absorbed into transmitter gain $T_i$. Signal x is selected as having good auto-correlation properties, such as, for example, a Zadow-Chu sequence or Gold sequence. A synchronizing trigger is required to align the beginning of a transmission sequence x with a receive sequence y. This allows for calibration of linear gain of the system.

In a second phase of the calibration, a modulated waveform is transmitted at a high power to explore non-linear characteristics.

Initially, 12 pair-wise transmit/receive experiments are performed and gains are measured a low transmit power to ensure that the transmission is in a linear region, at 402-414. Specifically, a transmit antenna index i is set to 0, and a receive antenna index j is set to 0, at 402. A processor determines whether i is equal to j, at 404. When i is equal to j, i is increased by 1, at 406. The processor determines whether i is equal to a desired i (e.g., 4), at 408. When i is not equal to the desired i, the method returns to 404 where it is determined if i is equal to. When i is not equal to j, a low power signal is transmitted on antenna i and received on antenna j, and a turnaround gain for the transmit-receive antenna pair i,j is measured, at 410. Next, i is increased by 1, at 406. When i is equal to the desired i at 408, the processor determines whether j is equal to a desired j (e.g., 3), at 412. When j is not equal to the desired j, i is reset to 0, and j is increased by 1, at 514, before the method returns to 404.

When j is equal to the desired j at 412, a matrix equation is formed, at 416, for example, with 12 turnaround gain measurements and 14 unknowns when the desired i is 4 and the desired j is 3. The values for i and j may be larger, which would also result in an increased number of measurements and unknowns. As shown above in Equation (2), the 14 unknowns include the transmit gain of each transmitting antenna, the receive gain of each receiving antenna, and each coupling between transmit and receive antennas. Further, as described above, the matrix equation is reduced to 12 unknowns by using normalized values of transmit gains, at 418.

The method also includes a high power transmission that pushes a PA into a non-linear region, at 420-428. Specifically, at 420, i is set to 0 and j is set to 1. A high power modulated signal is transmitted on antenna i and received on antenna j, and a receive sequence is measured, at 422. A DPD function $f_i$ is determined according to Equation (7) using a transmit sequence x, the measured receive sequence y, and the turnaround gain for the transmit-receive antenna pair $G_{ij}$, to match a gain and a phase of the normalized transmit gain at lower power, at 424.

$$f=(y_j/G_{ij})/x \qquad (7)$$

At 426, i is increased by 1 and j is computed as (i+1) mod 3. The processor determines whether i is equal to the desired i (e.g., 4), at 428. When i is not equal to the desired i, the method returns to 422 to transmit a high power modulated signal between a new transmit-receive antenna pair.

When i is equal to the desired i, a composite DPD is computed, at 430, as described in detail above, using input phase shift settings from 432.

Figure 5:
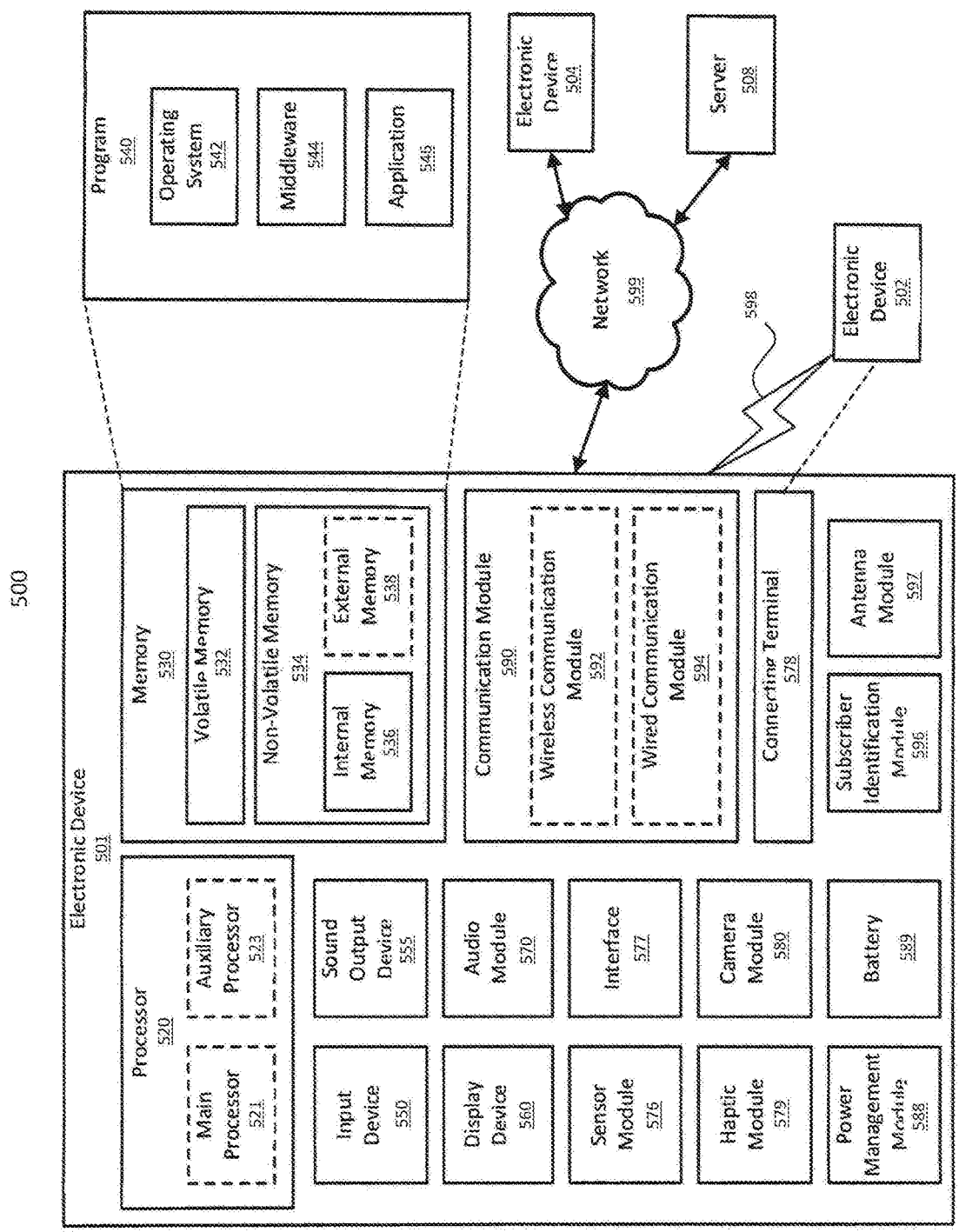
FIG. 5 is block diagram of an electronic device in a network environment, according to one embodiment.

FIG. 5 is a block diagram of an electronic device in a network environment, according to one embodiment. Referring to FIG. 5, an electronic device 501 in a network environment 500 may communicate with an electronic device 502 via a first network 598 (e.g., a short-range wireless communication network), or an electronic device 504 or a server 508 via a second network 599 (e.g., a long-range wireless communication network). The electronic device 501 may communicate with the electronic device 504 via the server 508. The electronic device 501 may include a processor 520, a memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (STM) 596, or an antenna module 597. In one embodiment, at least one (e.g., the display device 560 or the camera module 580) of the components may be omitted from the electronic device 501, or one or more other components may be added to the electronic device 501. Some of the components may be implemented as a single integrated circuit (IC). For example, the sensor module 576 (e.g., a fingerprint sensor, an iris sensor, or an illuminance sensor) may be embedded in the display device 560 (e.g., a display).

The processor 520 may execute, for example, software (e.g., a program 540) to control at least one other component (e.g., a hardware or a software component) of the electronic device 501 coupled with the processor 520, and may perform various data processing or computations. As at least part of the data processing or computations, the processor 520 may load a command or data received from another component (e.g., the sensor module 576 or the communication module 590) in volatile memory 532, process the command or the data stored in the volatile memory 532, and store resulting data in non-volatile memory 534. The processor 520 may include a main processor 521 (e.g., a central processing unit (CPU) or an application processor (AP)), and an auxiliary processor 523 (e.g., a graphics processing unit (GPU), an image signal processor (ISP), a sensor hub processor, or a communication processor (CP)) that is operable independently from, or in conjunction with, the main processor 521. Additionally or alternatively, the auxiliary processor 523 may be adapted to consume less power than the main processor 521, or execute a particular function. The auxiliary processor 523 may be implemented as being separate from, or a part of, the main processor 521.

The auxiliary processor 523 may control at least some of the functions or states related to at least one component (e.g., the display device 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). The auxiliary processor 523 (e.g., an image signal processor or a communication processor) may be implemented as part of another component (e.g., the camera module 580 or the communication module 590) functionally related to the auxiliary processor 523.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input device 550 may receive a command or data to be used by another component (e.g., the processor 520) of the electronic device 501, from the outside (e.g., a user) of the electronic device 501. The input device 550 may include, for example, a microphone, a mouse, or a keyboard.

The sound output device 555 may output sound signals to the outside of the electronic device 501. The sound output device 555 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 560 may visually provide information to the outside (e.g., a user) of the electronic device 501. The display device 560 may include, for example, a display, a hologram device, or a projector and control circuitry to control a corresponding one of the display, hologram device, and projector. The display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. The audio module 570 may obtain the sound via the input device 550, or output the sound via the sound output device 555 or a headphone of an external electronic device 502 directly (e.g., wired) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. The sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device 502 directly (e.g., wired) or wirelessly. The interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device 502. The connecting terminal 578 may include, for example, an HDMI connector, a USB connector, an SD card connector, or an audio connector (e.g., a headphone connector).

The haptic module 579 may convert an electrical signal into a mechanical stimulus (e.g., a vibration or a movement) or an electrical stimulus which may be recognized by a user via tactile sensation or kinesthetic sensation. The haptic module 579 may include, for example, a motor, a piezoelectric element, or an electrical stimulator.

The camera module 580 may capture a still image or moving images. The camera module 580 may include one or more lenses, image sensors, image signal processors, or flashes.

The power management module 588 may manage power supplied to the electronic device 501. The power management module 588 may be implemented as at least part of, for example, a power management integrated circuit (PMIC).

The battery 589 may supply power to at least one component of the electronic device 501. The battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more communication processors that are operable independently from the processor 520 (e.g., the AP) and supports a direct (e.g., wired) communication or a wireless communication. The communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or a standard of the Infrared Data Association (IrDA)) or the second network 599 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The antenna module 597 may transmit or receive a signal or power to or from the outside (e.g., the external electronic device) of the electronic device 501. The antenna module 597 may include one or more antennas, and, therefrom, at least one antenna appropriate for a communication scheme used in the communication network, such as the first network 598 or the second network 599, may be selected, for example, by the communication module 590 (e.g., the wireless communication module 592). The signal or the power may then be transmitted or received between the communication module 590 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

Commands or data may be transmitted or received between the electronic device 501 and the external electronic device 504 via the server 508 coupled with the second network 599. Each of the electronic devices 502 and 504 may be a device of a same type as, or a different type, from the electronic device 501. All or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, or client-server computing technology may be used, for example.

One embodiment may be implemented as software (e.g., the program 540) including one or more instructions that are stored in a storage medium (e.g., internal memory 536 or external memory 538) that is readable by a machine (e.g., the electronic device 501). For example, a processor of the electronic device 501 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method of calibrating digital pre-distortion (DPD) of an electronic device, the method comprising:
   receiving, by each of a first plurality of receiving antennas, a respective signal from each of a second plurality of transmitting antennas;
   determining a normalized transmit gain for each of the second plurality of transmit antennas from measurements of each transmit-receive antenna pair;
   determining a DPD function for each of the second plurality of transmitting antennas based on the received signals; and
   determining a combined DPD function of the second plurality of transmitting antennas based on the normalized transmit gain, the DPD functions, and phase shifter settings associated with the second plurality of transmitting antennas.

2. The method of claim 1, wherein the respective signal is a low power signal that ensures that a power amplifier of each of the second plurality of transmitting antennas is operating in a linear region.

3. The method of claim 2, wherein the low power signal is one of a Zadow-Chu sequence and a Gold sequence.

4. The method of claim 1, wherein the respective signals are consecutively transmitted from each of the second plurality of transmitting antennas to be individually received by each of the first plurality of receiving antennas.

5. The method of claim 4, wherein determining the normalized transmit gain for each of the second plurality of transmitting antennas comprises:
   obtaining a turnaround gain measurement for each transmit-receive antenna pair based on the respective signals; and
   determining the normalized transmit gain for each of the second plurality of transmitting antennas from the obtained turnaround gain measurements.

6. The method of claim 5, wherein determining the normalized transmit gain comprises:
   forming a matrix equation using the turnaround gain measurements and turnaround gain equations with unknowns for each transmit-receive antenna pair; and
   solving the matrix equation for the normalized transmission gain.

7. The method of claim 6, wherein the unknowns comprise a transmit gain of a transmitting antenna of the second plurality of transmitting antennas, a receive gain of a receiving antenna of the first plurality of receiving antennas, and a coupling gain coefficient between the transmitting antenna and the receiving antenna.

8. The method of claim 4, wherein determining the DPD function comprises:
consecutively transmitting a high power modulated signal from each of the second plurality of transmitting antennas;
measuring a receive sequence at an antenna of the first plurality of receiving antennas;
determining the DPD function for each of the second plurality of transmitting antennas based on the measured receive sequence for a given antenna and a turnaround gain for a corresponding transmit-receive antenna pair.

9. The method of claim 8, wherein the high power modulated signal ensures a power amplifier of each of the second plurality of transmitting antennas is operating in a non-linear region.

10. The method of claim 1, wherein the combined DPD is determined based on derived amplitude modulation-to-amplitude modulation (AM-AM) and amplitude modulation-to-phase modulation (AMPM) characteristics.

11. The method of claim 1, wherein the electronic device comprises the first plurality of receiving antennas and the second plurality of transmitting antennas.

12. A electronic device, comprising:
a first plurality of receiving antennas;
a processor; and
a non-transitory computer readable storage medium storing instructions that, when executed, cause the processor to:
receive, by each of the first plurality of receiving antennas, a respective signal from each of a second plurality of transmitting antennas;
determine a normalized transmit gain for each of the second plurality of transmitting antennas from measurements of each transmit-receive antenna pair;
determine a digital pre-distortion (DPD) function for each of the second plurality of transmitting antennas based on the received signals; and
determine a combined DPD function of the second plurality of transmitting antennas based on the normalized transmit gain, the DPD functions, and phase shifter settings associated with the second plurality of transmitting antennas.

13. The electronic device of claim 12, wherein the respective signal is a low power signal that ensures that a power amplifier of each of the second plurality of transmitting antennas is operating in a linear region.

14. The electronic device of claim 13, wherein the low power signal is one of a Zadow-Chu sequence and a Gold sequence.

15. The electronic device of claim 12, wherein the respective signals are consecutively transmitted from each of the second plurality of transmitting antennas to be individually received by each of the first plurality of receiving antennas.

16. The electronic device of claim 15, wherein, in determining the normalized transmit gain, the instructions further cause the processor to:
obtain a turnaround gain measurement for each transmit-receive antenna pair based on the respective signals; and
determine the normalized transmit gain for each of the second plurality of transmitting antennas from the obtained turnaround gain measurements.

17. The electronic device of claim 16, wherein, in determining the normalized transmit gain, the instructions further cause the processor to:
form a matrix equation using the turnaround gain measurements and turnaround gain equations with unknowns for each transmit-receive antenna pair; and
solve the matrix equation for the normalized transmission gain.

18. The electronic device of claim 17, wherein the unknowns comprise a transmit gain of a transmitting antenna of the second plurality of transmitting antennas, a receive gain of a receiving antenna of the first plurality of receiving antennas, and a coupling gain coefficient between the transmitting antenna and the receiving antenna.

19. The electronic device of claim 15, wherein, in determining the DPD function, the instructions further cause the processor to:
consecutively transmit a high power modulated signal from each of the second plurality of transmitting antennas;
measure a receive sequence at an antenna of the first plurality of receiving antennas; and
determine the DPD function for each of the second plurality of transmitting antennas based on the measured receive sequence for a given antenna and a turnaround gain for a corresponding transmit-receive antenna pair.

20. The electronic device of claim 19, wherein the high power modulated signal ensures a power amplifier of each of the second plurality of transmitting antennas is operating in a non-linear region.

21. The electronic device of claim 12, wherein the combined DPD is determined based on derived amplitude modulation-amplitude modulation (AM-AM) and amplitude modulation-phase modulation (AM-PM) characteristics.

22. The electronic device of claim 12, further comprising the second plurality of transmitting antennas.

* * * * *